United States Patent
Matteson

(10) Patent No.: US 8,560,132 B2
(45) Date of Patent: Oct. 15, 2013

(54) ADAPTIVE COOLING SYSTEM AND METHOD

(75) Inventor: Jason A. Matteson, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 12/833,526

(22) Filed: Jul. 9, 2010

(65) Prior Publication Data

US 2012/0010754 A1  Jan. 12, 2012

(51) Int. Cl.
*G05D 23/00* (2006.01)

(52) U.S. Cl.
USPC ........... 700/282; 700/300; 700/299; 165/287; 361/679.48; 702/64; 702/33

(58) Field of Classification Search
USPC .......................... 700/282, 300, 299; 165/287; 361/679.48; 702/64, 33
See application file for complete search history.

(56) References Cited

U.S. PATENT DOCUMENTS

| | | | |
|---|---|---|---|
| 5,777,897 A * | 7/1998 | Giorgio | ...................... 700/299 |
| 5,935,252 A | 8/1999 | Berglund et al. | |
| 6,643,128 B2 | 11/2003 | Chu et al. | |
| 6,697,254 B1 | 2/2004 | King et al. | |
| 6,814,546 B2 | 11/2004 | Sekiguchi | |
| 7,275,380 B2 | 10/2007 | Durant et al. | |
| 7,415,322 B1 | 8/2008 | Pearce et al. | |
| 7,426,109 B2 | 9/2008 | Lindell et al. | |
| 7,444,554 B2 | 10/2008 | Hori et al. | |
| 7,591,302 B1 | 9/2009 | Lenehan et al. | |
| 2005/0013114 A1* | 1/2005 | Ha | .................. 361/687 |
| 2006/0074585 A1 | 4/2006 | Reinberg et al. | |
| 2007/0297893 A1* | 12/2007 | Alon et al. | ....................... 415/47 |
| 2008/0306635 A1 | 12/2008 | Rozzi | |
| 2008/0310967 A1 | 12/2008 | Franz et al. | |
| 2009/0155045 A1* | 6/2009 | Chang et al. | .................... 415/17 |
| 2009/0222147 A1 | 9/2009 | Nakashima et al. | |
| 2009/0256512 A1* | 10/2009 | Begun et al. | .................. 318/471 |

OTHER PUBLICATIONS

IBM "Cooling Autonomics: Dynamic Impedance Control for Blades—"Smart Blades"", IP.com No. IPCOM000033492D, Publication date: Dec. 13, 2004, 6 pages.

* cited by examiner

*Primary Examiner* — Tejal Gami

(74) *Attorney, Agent, or Firm* — Cynthia G. Seal; Jeffrey L. Streets

(57) ABSTRACT

Embodiments of the invention include an adaptive system and method for cooling a computer system. A plurality of interchangeable fans may be provided for cooling the computer system. Each fan may have different operational limits, but with a minimum fan speed selected so that all of the fans produce substantially the same airflow rate at the respective minimum fan speed. In one embodiment, the operational limits are stored in a computer-readable storage medium on a computer system cooling fan. The stored fan speeds are electronically retrieved from the fan, and a fan speed table is automatically generated from the retrieved maximum and minimum fan speeds. The fan speed table includes cooling state values indexed to specific fan speed values. The fan is operated at a fan speed associated with a dynamically selected cooling state.

16 Claims, 4 Drawing Sheets

ADAPTIVE COOLING SYSTEM AND METHOD

BACKGROUND

1. Field of the Invention

The present invention relates to fan control in a computer cooling system.

2. Background of the Related Art

Computers consume electrical energy and generate heat. Many computers include fans to generate airflow for removing heat. Removing heat from a computer helps control internal temperatures, to maintain system reliability, performance, and longevity. Rack-mounted computers typically include several servers and other equipment in a high-density arrangement within a chassis, thus generating the combined heat of the servers and other equipment in the chassis. A blower module may be provided in the chassis external to the servers, having several fans to generate the large amount of airflow through the chassis required to cool the servers. In a data center, the heated exhaust air from a rack may be transported to a computer-room air conditioner ("CRAC"), which cools the air before returning the cooled air to the data center. Energy efficiency in a datacenter dramatically affects the total cost of ownership of datacenter equipment.

Server systems are often designed around a particular set of design objectives. While performance and efficiency are both desirable objectives, a particular system will typically emphasize or prioritize one objective over the other. For example, some market segments choose to focus on energy efficiency, such that performance is not the primary focus. Conversely, other market segments emphasize performance as paramount over energy efficiency. However, there is a clear trade-off between energy efficiency and performance. A performance-focused system imposes greater cooling demands, often using more exotic technologies, with higher-cost fan models. A system focused on energy efficiency may be implemented with comparatively less expensive and lower-power fan models.

BRIEF SUMMARY

One embodiment of the present invention provides a method wherein maximum and minimum fan speeds of a fan are electronically retrieved from a computer readable storage medium on the fan. A fan speed table is automatically generated from the retrieved maximum and minimum fan speeds. The fan speed table includes a plurality of fan speed values from a range of the minimum fan speed to the maximum fan speed, and cooling state values indexed to the fan speed values. A cooling state value is dynamically selected based on one or more sensed system parameters of the computer system. The fan is operated at the fan speed associated with the dynamically selected cooling state value.

Another embodiment of the invention provides a computer system that includes at least a first fan having a maximum fan speed and a minimum fan speed encoded in a machine-readable storage medium on the first fan. A chassis management module is configured for electronically retrieving the stored maximum and minimum fan speeds and automatically generating a fan speed table based on the retrieved maximum and minimum fan speeds. The fan speed table includes a plurality of fan speed values between the minimum fan speed and the maximum fan speed and a plurality of cooling state values indexed to the plurality of fan speed values. Each cooling state is uniquely associated with a respective one of the fan speed values. A node has a local controller configured for dynamically requesting a cooling state based on one or more variable system parameters of the computer system. A fan controller is provided for controlling the fan to generate airflow through the chassis at the fan speed associated with the requested cooling state.

DETAILED DESCRIPTION

Embodiments of the invention include an adaptive computer cooling system and method, wherein a fan is controlled according to fan-specific operational limits without requiring any manual modification of code used by a controller in controlling the fan. In one embodiment, a plurality of interchangeable fans is provided. The operational limits of each fan, including maximum and minimum fan speeds, are stored as Vital Product Data on a computer readable storage medium secured to the fan. Different fans may include different maximum and minimum fan speeds. The minimum fan speeds to be encoded as VPD are selected so that each fan generates about the same volumetric airflow rate at its minimum fan speed. A controller, such as a chassis management module, retrieves the maximum and minimum fan speeds from the fan and automatically generates a fan speed table from the stored fan speeds.

The fan speed table includes a plurality of numerically denoted cooling states, wherein each cooling state value is uniquely associated with a particular volumetric flow rate in cubic feet per minute (CFM). The cooling state values are normalized, so that a cooling state of 1.0 corresponds to the minimum fan speed. The cooling state is the basis upon which fan speed is then controlled. By virtue of normalizing the cooling state values in the fan speed table, any fan according to this system or method will produce substantially the same volumetric air flow rate for any particular cooling state value. Fans having a higher maximum fan speed may achieve higher cooling state values and correspondingly higher volumetric air flow rates. Each node of a computer system can now articulate its specific cooling needs by requesting a cooling state, which may then be enforced by the corresponding fan speed selected from a fan speed table uniquely and automatically generated from the fan-specific operational limits. This approach and architecture gives the computer system flexibility and versatility in generating the minimum airflow effective for cooling the nodes.

Certain aspects of the invention are discussed, by way of example, in the context of a rack-mountable computer system having multiple servers configured as nodes. Each node has the ability to request a cooling state using a local controller (e.g. an integrated management module, or "IMM"). Each node requests the cooling state according to a variable system parameter. One or more of the available system parameters may be node parameters, which are system parameters specific to a node. Then, a controller, such as a chassis management module, dynamically selects from among the cooling states requested by the nodes and operates the fan according to the dynamically selected cooling state. However, one skilled in the art having benefit of this disclosure will appreciate that these inventive aspects may be equally applied to other computer systems that use fans or blower modules for cooling.

Figure 1:
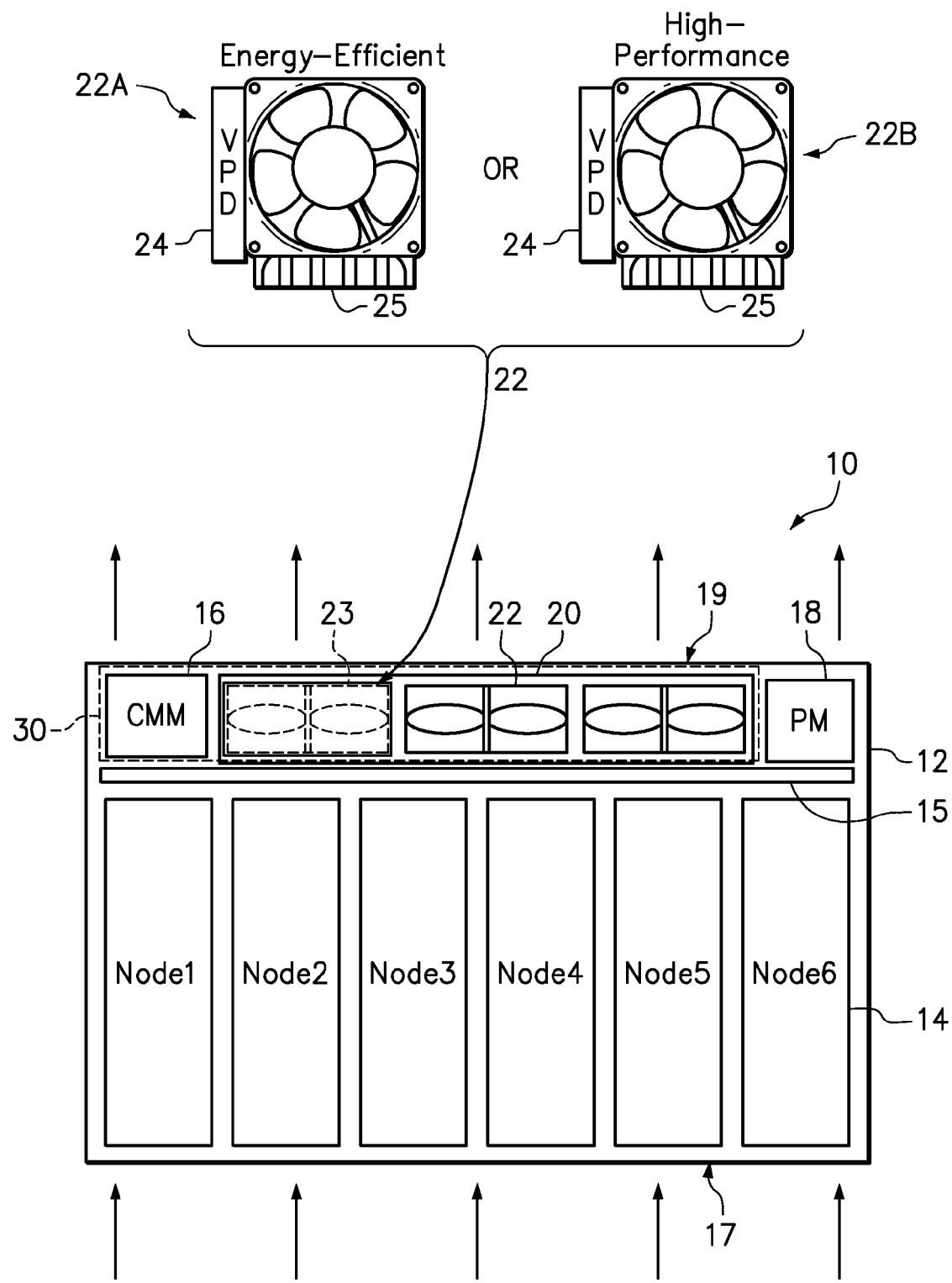
FIG. 1 is a schematic diagram of a multi-server computer system that may be cooled using an adaptive cooling algorithm according to an embodiment of the invention.

FIG. 1 is a schematic diagram of a multi-server computer system 10 that may be cooled using an adaptive cooling algorithm according to an embodiment of the invention. The computer system 10 includes, by way of example, a rack-mountable "6U" chassis 12 with six blade servers 14, shown in plan view. The blade servers 14 are modular, allowing the blade servers 14 to be hot plugged into the computer system 10 by inserting any one or more of the servers 14 into the chassis 12. Each blade server 14 is independently configured as a separate node of the computer system 10, although the system 10 may alternatively be configured with more than one server per node, which may be referred to as a "supernode."

Support modules in the chassis 12 provide shared resource to the servers 14. The illustrated support modules include a chassis management module ("CMM") 16, a power supply module 18, and a blower module 20. The power supply module 18 provides power to the servers 14, blower module 20, and other components of the computer system 10. The blower module 20 generates airflow through the chassis 12 (represented by arrows) for cooling the computer system 10 by removing heat generated by the servers 14 and other heat-generating components. The chassis management module 16 includes a management processor uniquely associated with the chassis 12 to perform chassis-management tasks, such as managing a chassis power policy, monitoring component temperatures, generating system alerts, and other systems management tasks at a chassis level. The servers 14 and various support modules are in electronic communication over a midplane 15, which is a printed circuit board providing electronic power and data signal pathways. In an alternate chassis configuration, the servers and support modules may instead be connected over a backplane or using cable connections. Connectors on the midplane 15 allow the servers 14 and support modules to be hot-plugged into the computer system 10, as generally understood in the art.

The blower module 20 includes a plurality of fans 22 which may be operated separately or collectively for generating airflow through the chassis 12. The net airflow generated by the blower module 20 is from an air inlet 17 at the front of the chassis 12 to an air outlet 19 at the rear of the chassis 12. Within the chassis 12, the airflow generated by the blower module 20 may be guided along various flow paths (not explicitly shown) engineered into the chassis 12 to direct airflow to the servers 14 and other components for targeted cooling the servers and other components. The use of multiple fans 22 may generate a greater volumetric rate of airflow than would be generated by a single fan, and may also provide greater efficiency (e.g. in terms of watts per cubic foot) than a single fan operated at a higher rate of speed to achieve the same volumetric airflow rate. The modular aspect of the blower module 20 allows the entire blower module 20, with the included fans 22, to be removed for servicing or replacement, or individually servicing or replacing fans in a computer system.

An energy-efficient fan 22A and a high-performance fan 22B are provided as examples of fans 22 that are interchangeable within the blower module 20. Each fan 22A, 22B may have the same connector 25, or an adapter may be included, if required, allowing either of the fans 22A, 22B to be interchangeably connected to a fan socket 23. The fan socket 23 represents any suitable connection type that receives the fan connector 25 of one of the fans 22 for providing power and control signals to that fan 22. The connector 25 and fan socket 23 may be any of a plurality of corresponding connection types known in the art, or a proprietary connection type. Although different fans are interchangeable with the fan sockets 23, the blower module 20 will typically be populated with fans of the same type. For example, the blower module 20 may include three of the energy-efficient fans 22A or three of the high-performance fans 22B, to optimize the cooling system 30 for either energy efficiency or performance. The blower module 20 may also include a connector (not shown) for connecting to a corresponding connector on the midplane 15, for connecting the blower module 20. The chassis management module 16 may thereby communicate with the blower module 20 over the midplane 15, or other communication pathway.

Each of the different, interchangeable fan types have a unique set of operational limits. For example, the operational limits of the energy-efficient fan 22A and high-performance fan 22B may include different maximum and minimum fan speeds, which may be expressed in revolutions per minute (RPM) of a fan blade. The minimum and maximum fan speeds are selected, non-zero limits to be imposed on each fan and enforced by a controller, rather than intrinsic physical limitation of the fans themselves. The minimum fan speed for each fan is selected so that the fans 22A, 22B (and other fans selected for the cooling system 30) each produce the same non-zero airflow rate at their corresponding minimum fan speed. Thus, for example, the minimum fan speeds have been specifically selected so that the high-performance fan 22B produces the same airflow rate at its minimum fan speed as the energy-efficient fan 22A produces at its minimum airflow rate. However, the high-performance fan 22B generates greater airflow at its maximum fan speed than the energy-efficient fan 22A produces at its maximum fan speed. The fan speeds, and optionally other operational limits of a fan, are encoded in a computer-readable storage medium provided with each fan 22. For example, the respective operational limits of the energy-efficient fan 22A and the high-performance fan 22B may be encoded as Vital Product Data (VPD) 24 included with each fan 22. The Vital Product Data 24 may be characterized in a laboratory and stored on a computer readable storage medium. The computer readable storage medium may be included on an integrated circuit, such as an application-specific integrated circuit (ASIC) or microchip included with each fan 22A, 22B.

The chassis management module 16 and blower module 20 cooperate as components of an adaptive cooling system 30 (further detailed in FIG. 2) for cooling the servers 14. In addition to its conventional chassis management duties, the chassis management module 16 is configured, according to an embodiment of the invention, to implement an adaptive fan control algorithm. This fan control algorithm includes automatically adapting to the particular operational limit(s) of the fans 22. The fan speeds stored in Vital Product Data 24 are used by the chassis management module 16 to automatically adapt to the different fans 22A, 22B without a human operator manually programming fan speeds into the chassis management module 16. The chassis management module 16 automatically retrieves Vital Product Data 24 from the fans and controls the blower module 20 according to the retrieved fan speeds. The offering of different fans with different minimum and maximum fan speeds preprogrammed into Vital Product Data 24 allows for seamless integration of the selected fans, without having to manually program or modify code of a cooling algorithm executed by the chassis management module 16.

Figure 2:
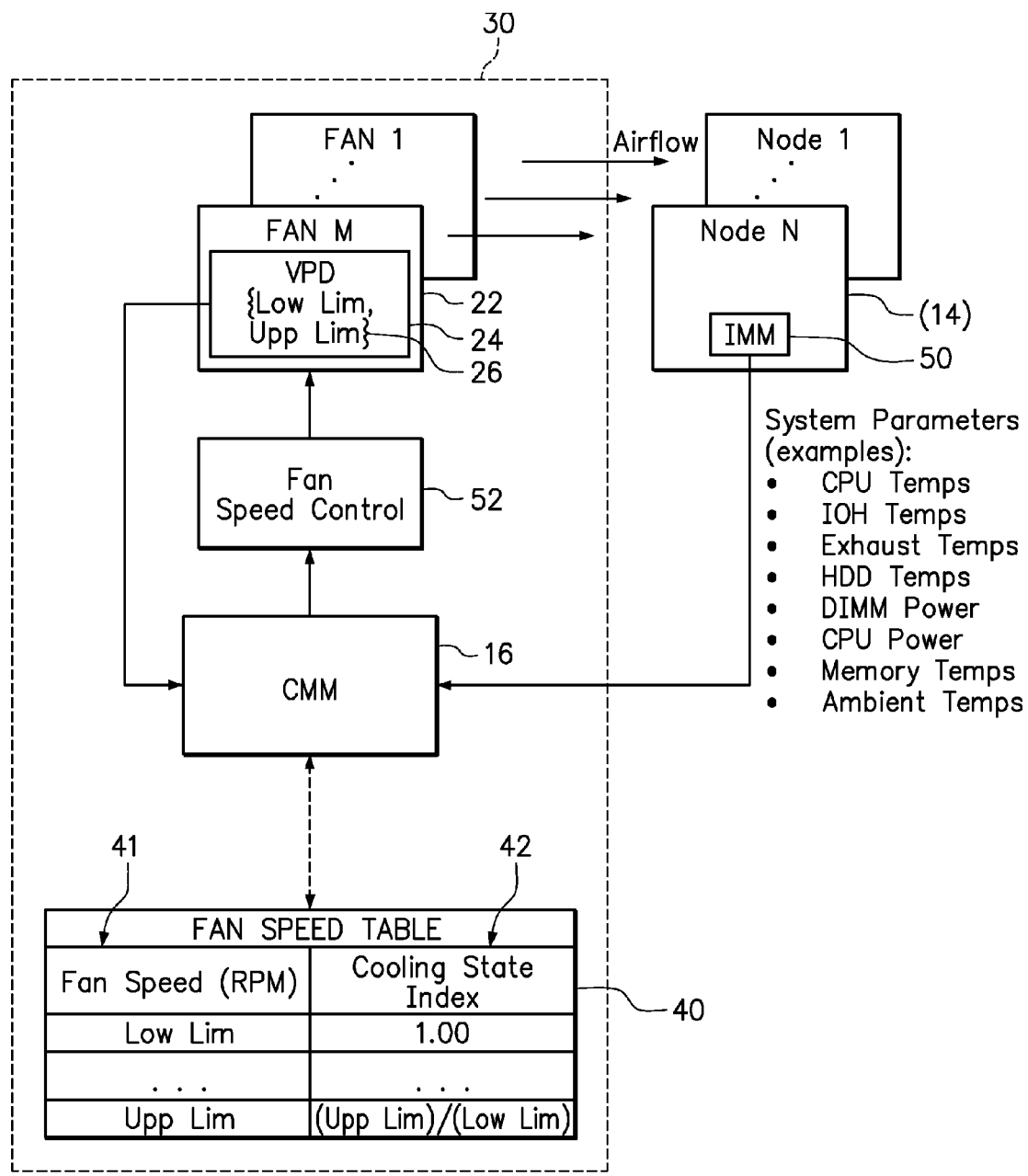
FIG. 2 is a schematic diagram further detailing the cooling system for cooling the nodes of a multi-node computer system.

FIG. 2 is a schematic diagram further detailing the cooling system 30 for cooling the nodes of a multi-node computer system. The diagram of the cooling system 30 is generalized to any multi-node computer system, but is applicable to the example of the multi-server computer system 10 of FIG. 1. A number "M" of fans 22 are included, which may be controlled according to maximum and minimum fan speeds 26 provided in Vital Product Data 24. The fans 22 may be controlled individually, wherein the fan speed of each fan 22 is independently controlled. Alternatively, the fans 22 may be controlled as a group, such as in the blower module 20 of FIG. 1, wherein all of the fans 22 are driven at the same, dynamically-selected fan speed. A number "N" of nodes of a multi-node computer system to be cooled by the cooling system 30 are labeled from Node 1 to Node N. As applied to the computer system 10 of FIG. 1, for example, the nodes represent the blade servers 14 (with M=6). A one-to-one correspondence of fans to nodes is not required. Thus, the number "N" of nodes and the number "M" of fans need not be equal.

The chassis management module 16 automatically retrieves the fan speeds 26 from the Vital Product Data 24 and generates a fan speed table 40 for each fan 22 based upon the retrieved fan speeds 26 for that fan. The chassis management module 16 may retrieve the fan speeds 26 and generate the fan speed table 40 in response to one of the fans 22 having been connected to the cooling system 30, or in response to powering on or booting the computer system 10. A first column (the "fan speed column") 41 of the fan speed table 40 includes a plurality of discrete fan speed values at which the fan 22 is operable. A second column (the "cooling state index") 42 of the fan speed table 40 includes a plurality of cooling state values that may be used as an index to the fan speed column 41. The fan speeds 41 and cooling states 42 may be entirely derived from the maximum and minimum fan speeds. A desired level of fan control granularity may be obtained by generating the fan table 40 with as many incremental steps as desired, such as to achieve a fine fan speed adjustment along with a precise fan control.

The fan speeds in the fan speed column 41 are values generated within the range from the minimum fan speed to the maximum fan speed. Here, the range of fan speed values generated are from the minimum fan speed to the maximum fan speed, inclusively; however, the range of fan speed values is not required to include the maximum and minimum fan speed in every instance, so long as the fan speed values are within the range of the maximum and minimum fan speed. The cooling states are values selected as an index to the fan speeds. In this embodiment, the cooling states are values scaled with respect to the minimum fan speed, such that the cooling state associated with the minimum fan speed thus has a value of 1.0, and the cooling state associated with the maximum fan speed has a value equal to the ratio of the maximum fan speed to the minimum fan speed. The process of obtaining cooling state values that are scaled with respect to fan speed is alternately referred to herein as normalizing. Example fan speed tables for the energy-efficient fan type and high-performance fan type are provided in FIG. 3, as discussed below. It should be recognized that the "fan speed table" is a collection of related data, but it is not necessary that the data structure actually resemble a table. Furthermore, the "fan speed table" may simply be an algorithm that allows the controller to calculate appropriate cooling states and fans speeds as needed to operate the fans.

A local controller 50 is provided in association with each node 14. In this embodiment, the local controller 50 includes an Integrated Management Module (IMM). Another example of a suitable local controller 50 includes a baseboard management controller ("BMC"). The IMM 50 monitors variable system parameters upon which an amount of airflow required to cool the nodes 14 may depend. As listed in FIG. 2, examples of system parameters upon which an amount of airflow may depend include temperatures, such as a central processing unit (CPU) temperature, an input/output hub (IOH) temperature, a hard disk drive (HDD) temperature, and heated air exhaust temperatures, which may be measured by various system temperature sensors. Other examples of system parameters upon which airflow may depend include power consumption values, such as a dual in-line memory module (DIMM) power consumption and CPU power consumption. Node parameters are a subset of the system parameters specific to a particular node. A particular node may request a cooling state determined according to one or more system parameters, whether generally system parameters or node parameters of that particular node. In one embodiment, the ambient/inlet temperature may be the primary input, and may be weighted higher as a factor in the selection of an airflow rate than another, secondary input, in selecting a required amount of cooling.

When the cooling system 30 is initiated, the IMM 50 or other local controller of each node 14 may select an initial cooling state based on relevant system parameters and requests that the chassis management module 16 operate the fans at the fan speed associated with the initial cooling state as provided by the table 40. Once the node 14 and the chassis management module 16 agree that enough cooling exists, the node 14 may be initially powered on. Subsequently, component temperature and power sensing circuits used to monitor the system parameters will trigger the need to increment or decrement the cooling states 42 selected by the IMM 50.

In one example algorithm, the IMM 50 of each node requests a particular cooling state, which is communicated from the respective node 14 to the chassis management module 16. All of the fans 22 may be of the same type, in which case the cooling state dynamically requested by the IMM 50 may result in all of the fans 22 being operated at the same, dynamically adjusted speed. When different nodes request different cooling states at a particular moment, the chassis management module 16 may select from among the cooling states requested by all of the nodes 14. Typically, the chassis management module 16 selects the highest cooling state requested by any of the nodes in order to prevent any of the nodes from overheating.

The chassis management module 16 dynamically selects the value of a cooling state 42 from the fan speed table 40 and submits the corresponding fan speed to a fan speed controller 52 of each fan 22. The fan speed controller 52 converts the fan speed to a control signal that causes the fan 22 to operate at the fan speed (column 42) associated with the selected cooling state (column 41) from the fan speed table 40. The fan speed controller 52 may generate a pulse width modulation (PWM) signal to enforce the fan speed associated with the dynamically-selected cooling state 42. Less commonly, the fan speed controller 52 may include a linear voltage control circuit that varies the fan speed in relation to the magnitude of the voltage.

Figure 3:
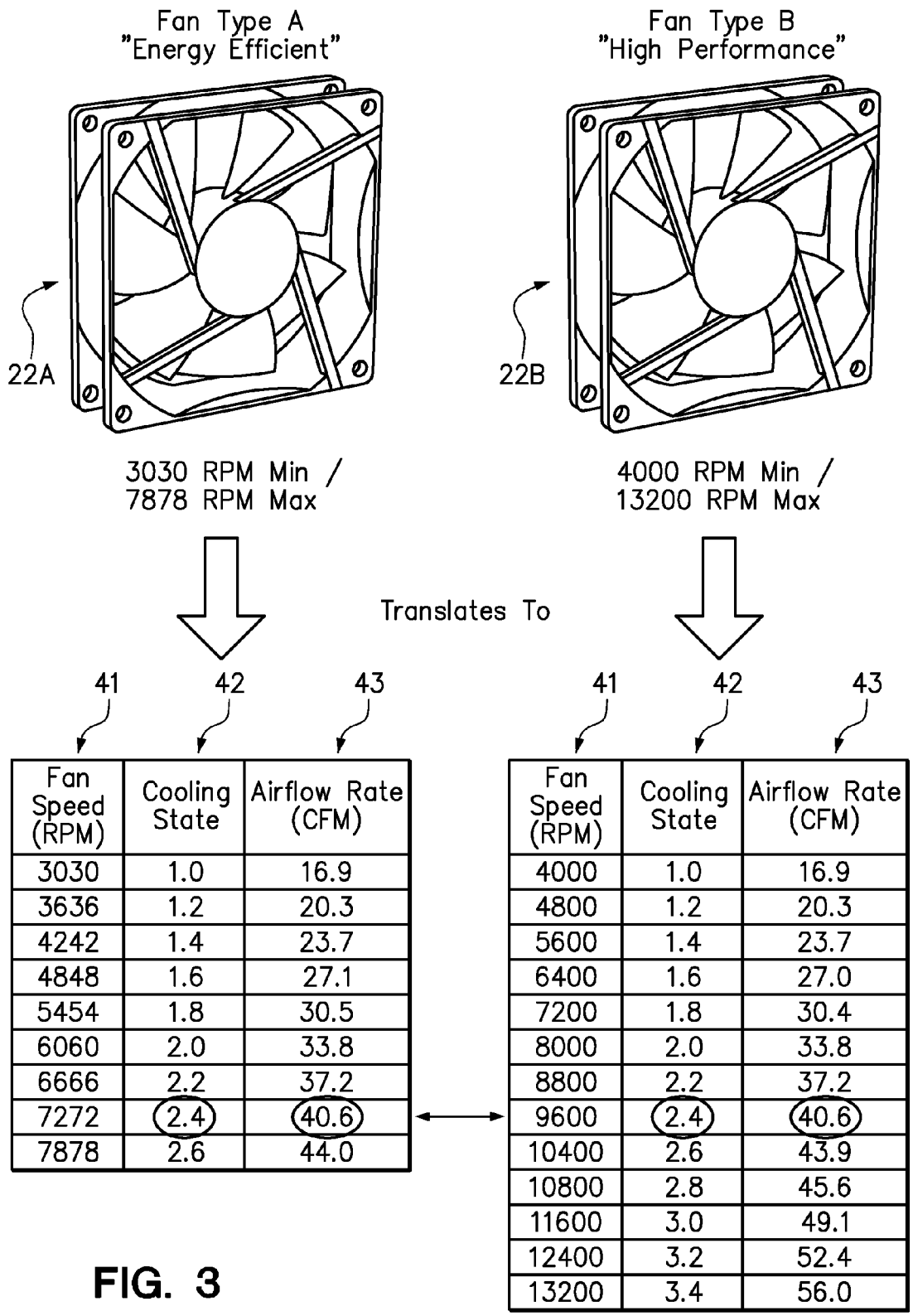
FIG. 3 is a comparison of fan speed tables generated for examples of an energy-efficient fan and a high-performance fan.

FIG. 3 is a comparison of example fan speed tables 40A, 40B generated for the energy-efficient fan 22A and the high-performance fan 22B, respectively. Each table 40A, 40B includes a fan speed column 41 and a cooling state column 42 that may be used as an index to the fan speed column 41. A flow rate column 43 is included in the tables for reference. The energy efficient fan has a minimum fan speed of 3030 RPM and a maximum fan speed of 7878 RPM. The high-performance fan has a minimum fan speed of 4000 RPM and a maximum fan speed of 13600 RPM. The cooling states for each fan 22A, 22B may be derived entirely from these minimum and maximum fan speeds. The (hypothetical) minimum fan speeds selected for each fan 22A, 22B have values predetermined in a laboratory to produce the same airflow rate (16.9 CFM, in this example) by the respective fans 22A, 22B. The cooling state values are then scaled according to the minimum fan speed of each fan to produce the cooling state index. As a result of this normalization, the minimum cooling state for each fan 22A, 22B (and any other fan used with this system) has a value of 1.0, and the maximum cooling state for each fan has a value equal to the ratio of the maximum fan speed divided by the minimum fan speed.

According to affinity laws for fans, the airflow rate generated by a fan is proportional to the fan speed. For example, doubling the fan speed of the energy efficient fan 22A from 3030 RPM to 6060 RPM is expected to double the airflow rate from 16.9 CFM to 33.8 CFM. As a result of scaling the cooling state values according to the minimum fan speed, the same cooling state value will produce about the same airflow in either fan 22A, 22B. For example, if a cooling state value of 2.4 is selected, either fan 22A, 22B will produce about 40.6 CFM of airflow. Each fan 22A, 22B produces this airflow at a different RPM, but due to having selected a minimum fan speed in the laboratory that produces the same minimum airflow rate and by scaling the cooling state values according to the minimum fan speed in generating the fan speed table, a chassis management module may simply select a particular amount of cooling by selecting a (normalized) cooling state value, no matter which fan 22A, 22B is installed. However, the high-performance fan is able to produce a higher maximum airflow rate of 56.0 CFM due to a proportionally higher maximum fan speed. Thus, the chassis management module will be able to select greater amounts of cooling using higher cooling state values when the high-performance fan 22B is installed.

The chassis management module optionally generates the cooling state values using fixed increments from the lowest cooling state value of 1.0 to the maximum cooling state for the particular fan. The size of the increment is selected to give the desired level of granularity. In the two example fan tables 40A, 40B, the selected increment between cooling state values is 0.2. Using the same increment of 0.2, the wider range of fan speeds provided by the high-performance fan 22B provides a greater number of cooling state increments for the high-performance fan 22B than the energy-efficient fan 22A. The cooling state values provide an index to the range of fan speeds uniquely provided by different fan types or model numbers.

Figure 4:
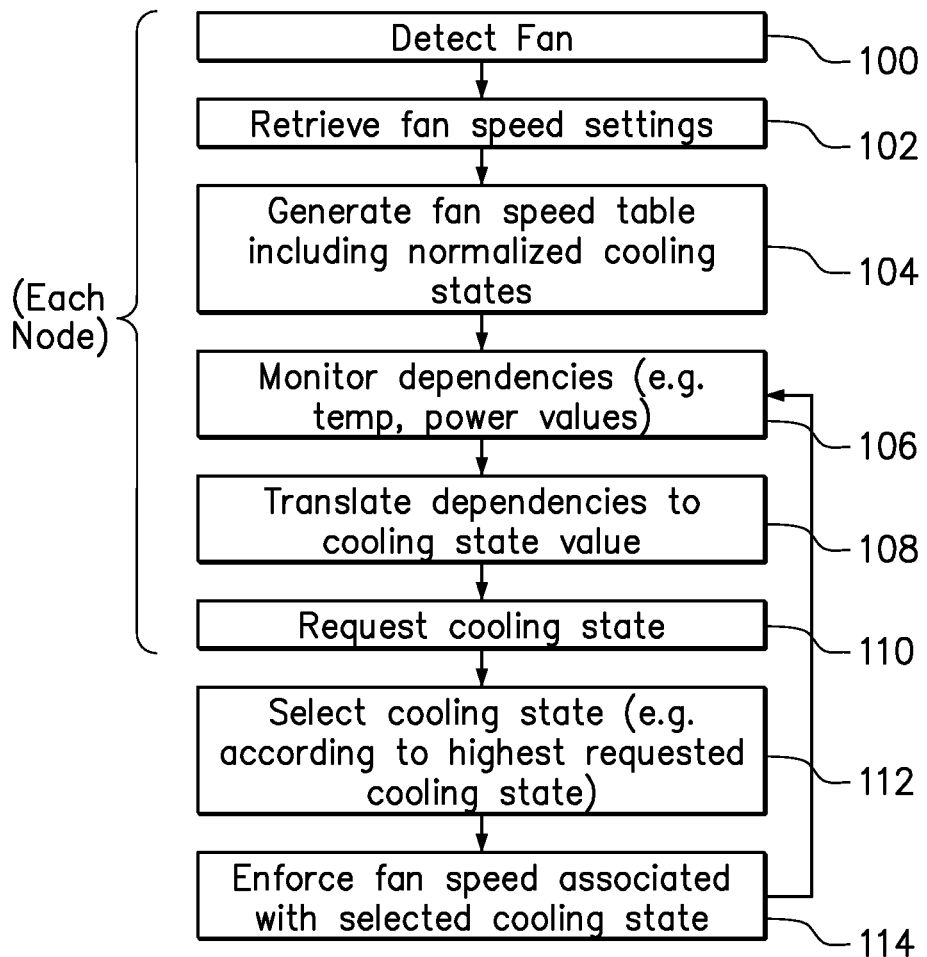
FIG. 4 is a flowchart of an adaptive cooling algorithm for a multi-node computer system according to an example embodiment of the invention.

FIG. 4 is a flowchart of an adaptive cooling algorithm for a multi-node computer system according to an example embodiment of the invention. Steps 100 through 110 apply to each node of the computer system. The presence of a fan is detected in step 100. The presence of the fan may be detected in response to connection of the fan to a fan socket in a cooling section of a multi-node computer system. Alternatively, the fan may be detected upon startup, booting, or other initialization or powering-on process. The fan speed settings will have been pre-stored on the fan, such as in the form of Vital Product Data stored on a computer readable storage medium provided with the fan. The minimum fan speed for each fan will be selected so that all the fans will produce about the same minimum airflow rate at the respective minimum fan speed.

A chassis management module retrieves the fan speed settings in step 102, and generates the fan speed table in step 104. According to step 106, various system parameters are monitored, such as ambient and component temperature values and power consumption values. A cooling state value is selected by each node in step 108. A local controller of the node then requests a cooling state value from the chassis management module in step 110. The chassis management module receives the cooling state requests from each node, and in step 112 selects a cooling state from among those requested. The cooling state to be enforced may be selected, for example, as the largest of the requested cooling state values, to ensure the largest fan speed and associated airflow rate required of the participating nodes. The fan speed associated with the selected cooling state is then enforced in step 114, such as by controlling the voltage to the fan(s) to which the selected cooling state applies.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage medium(s) having computer readable program code embodied thereon.

Any combination of one or more computer readable storage medium(s) may be utilized. The computer readable storage medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, an application-specific integrated circuit, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable storage medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
   electronically retrieving maximum and minimum fan speeds of a fan from a computer readable storage medium on the fan;
   automatically generating a fan speed table from the retrieved maximum and minimum fan speeds, the fan speed table including a plurality of fan speed values from a range of the minimum fan speed to the maximum fan speed and cooling state values indexed to the fan speed values;
   dynamically selecting a cooling state value based on one or more sensed system parameters of the computer system;
   operating the fan to generate airflow through a chassis at the fan speed associated with the dynamically selected cooling state value; and
   setting a minimum cooling state value equal to 1 and a maximum cooling state value equal to the ratio of the maximum fan speed to the minimum fan speed.

2. The method of claim 1, further comprising:
   generating the cooling state values with a fixed-increment granularity.

3. The method of claim 1, further comprising:
   communicating the stored fan speeds from the fan to a chassis management module for the chassis management module to generate the fan speed table, dynamically select a cooling state, and operate the fan at the fan speed associated with the dynamically selected cooling state.

4. The method of claim 1, further comprising:
   storing the maximum and minimum fan speeds as part of Vital Product Data uniquely associated with the fan.

5. The method of claim 1, further comprising:
requesting a plurality of cooling state values, and determining each requested cooling state value at least partially as a function of a node parameter of a different node; and
dynamically selecting the cooling state from among the requested cooling state values.

6. The method of claim 5, further comprising:
dynamically selecting the largest of the requested cooling state values.

7. The method of claim 1, further comprising:
retrieving the maximum and minimum fan speeds in response to the fan being connected with a computer system.

8. The method of claim 1, further comprising:
retrieving the maximum and minimum fan speeds during an initialization procedure.

9. A computer system, comprising:
a first fan having a maximum fan speed and a minimum fan speed encoded in a machine-readable storage medium on the first fan;
a chassis management module configured for electronically retrieving the stored maximum and minimum fan speeds and automatically generating a fan speed table based on the retrieved maximum and minimum fan speeds, the fan speed table including a plurality of fan speed values between the minimum fan speed and the maximum fan speed and a plurality of cooling state values indexed to the plurality of fan speed values, each cooling state uniquely associated with a respective one of the fan speed values;
a node having a local controller configured for dynamically requesting a cooling state based on one or more variable system parameters of the computer system;
a fan controller for controlling the fan to generate airflow through the chassis at the fan speed associated with the requested cooling state; and
the computer system setting a minimum cooling state value equal to 1 and a maximum cooling state value equal to the ratio of the maximum fan speed to the minimum fan speed.

10. The computer system of claim 9, further comprising:
a second fan interchangeable with the first fan and having a maximum and minimum fan speed encoded in a machine-readable storage medium on the second fan, wherein the minimum fan speed of the second fan is selected to produce the same volumetric airflow rate as the minimum fan speed of the first fan.

11. A computer program product including computer usable program code embodied on a non-transitory computer usable storage medium, the computer program product comprising:
computer usable program code containing stored maximum and minimum fan speeds of a fan,
computer usable program code for electronically retrieving the stored maximum and minimum fan speeds of the fan;
computer usable program code for automatically generating a fan speed table from the retrieved maximum and minimum fan speeds, the fan speed table including a plurality of fan speed values from a range of the minimum fan speed to the maximum fan speed and cooling state values indexed to the fan speed values;
computer usable program code for dynamically selecting a cooling state based on one or more sensed system parameters of the computer system;
computer usable program code for operating the fan to generate airflow through a chassis at the fan speed associated with the dynamically selected cooling state; and
computer usable program code for setting a minimum cooling state value equal to 1 and a maximum cooling state value equal to the ratio of the maximum fan speed to the minimum fan speed.

12. The computer program product of claim 11, further comprising:
computer usable program code for the cooling state values with a fixed-increment granularity.

13. The computer program product of claim 11, further comprising:
computer usable program code for requesting a plurality of cooling state values, and determining each requested cooling state value at least partially as a function of a node parameter of a different node; and
computer usable program code for dynamically selecting the cooling state from among the requested cooling state values.

14. The computer program product of claim 13, further comprising:
computer usable program code for dynamically selecting the largest of the requested cooling state values.

15. The computer program product of claim 11, further comprising:
computer usable program code for retrieving the maximum and minimum fan speeds in response to the fan being connected with a computer system.

16. The computer program product of claim 11, further comprising:
computer usable program code for retrieving the maximum and minimum fan speeds during an initialization procedure.

* * * * *